May 7, 1968 G. J. BORNER 3,382,414

MULTIDECK CIRCUIT BOARD ASSEMBLY AND RESILIENT ELECTRICAL CONNECTORS THEREBETWEEN

Filed Dec. 28, 1965

INVENTOR:
Gerhard J. Borner
By Keith D. Beecher
Attorney

United States Patent Office 3,382,414

Patented May 7, 1968

3,382,414

MULTIDECK CIRCUIT BOARD ASSEMBLY AND RESILIENT ELECTRICAL CONNECTORS THEREBETWEEN

Gerhard J. Borner, Northridge, Calif., assignor to The Dorann Company, Northridge, Calif., a partnership composed of Gerhard J. Borner and Willis W. Brunsell Filed Dec. 28, 1965, Ser. No. 516,930
4 Claims. (Cl. 317—101)

ABSTRACT OF THE DISCLOSURE

A multideck circuit board assembly is described in the following specification, together with resilient connectors interconnecting the circuits on the individual circuit boards which make up the assembly, so as to permit the individual circuit boards to be hinged so as to facilitate servicing and the like, and yet maintain electrical contact between the circuits on the various boards.

The present invention relates generally to electrical and electronic equipment; and it relates more particularly to an improved terminal board assembly, or the like, for use in such equipment. The invention also relates to supports for such a terminal board, and to resilient connectors which serve to connect circuitry on the terminal board to other circuitry in the equipment.

It is usual practice in present day electronic and electrical equipment, for example, to support the various electronic and electrical components on insulating terminal or circuit boards. The circuitry interconnecting the components is usually formed by printed circuit techniques directly on the boards.

It is also usual to support the terminal boards, or the like, bearing such components and circuitry in spaced relationship with other boards, or with other bases in the equipment.

However, the usual support of the terminal boards in electronic equipment creates difficulties, when it is desired to test or service the equipment. This is because the various terminal boards in the prior art equipment must be removed from the base, this being a relatively difficult and time-consuming procedure, and one creating the likelihood of short-circuits and damage to the overall equipment.

An object of the present invention is to provide an improved terminal board assembly, and to provide improved support and connector elements therefor, by means of which the terminal board may be mounted on the base in a hinged relationship with the base.

Another object of the invention is to provide such an improved terminal board assembly, and stand-off supports therefor, which permits full advantage to be taken of the capacity of the terminal board in mounting electrical and electronic components thereon, and which still permits inspection and servicing of the equipment to be made without costly and time-consuming disassembling and assembling operations.

Another object of the invention is to provide improved electrical connectors for use in such an assembly, which connectors are resilient in nature, and which may be flexed back and forth repeatedly without any tendency to wear or break; so that they may be used for long periods of time in the equipment, even though frequent servicing takes place.

Yet another object of the invention is to provide such an improved terminal board assembly which permits components to be conveniently mounted on both the top and bottom of the terminal board, and yet to be readily accessible for testing or servicing purposes, thereby enabling the number of boards required in any given electrical equipment to be reduced to an absolute minimum.

A still further object of the invention is to provide such an improved terminal board assembly which is constructed to permit complete check-out of the components and circuitry on both the bottom and top of the terminal board in a simplified manner and with a minimum of a disassembling operations.

Yet another object of the invention is to provide such an improved assembly which is constructed and conceived so that such servicing can be carried out with the terminal board itself being rigidly retained on the base structure, so that the possibility of damage to the board or other components, or of creating short circuits in the equipment, is virtually eliminated.

Other objects and advantages of the invention will become apparent from a consideration of the following specification, when the specification is considered in conjunction with the accompanying drawing, in which.

Figure 1:
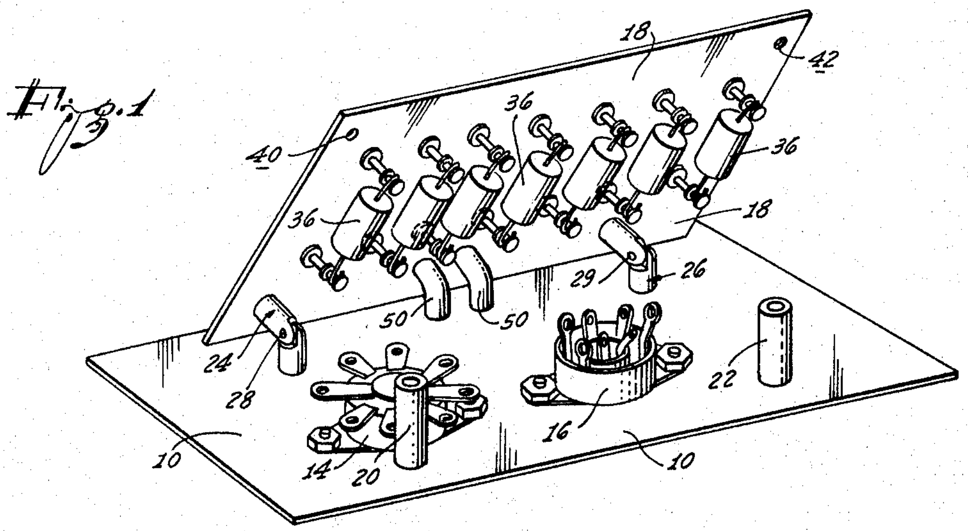
FIGURE 1 shows typical electronic equipment incorporating the concepts of the present invention.

The assembly shown in FIGURE 1, for example, includes a base 10. Various electronic components, such as a pair of sockets 14 and 16, are mounted on the base 10. These components may be interconnected, for example, to other components and to one another, through appropriate circuitry (not shown), which circuitry may be imprinted directly on the base 10.

A terminal board 18 composed, for example, of insulating material is supported in spaced and parallel relationship on the base 10 by a plurality of stand-off elements 20, 22, 24 and 26. The elements 20 and 22 may be typical bushings composed, for example, of a rigid metallic or insulating material, and having a threaded bore at each end.

The stand-off elements 20 and 22 serve as posts, and they may be supported on the base 10 by appropriate screws extending through the base and threaded into the posts.

The stand-off elements 24 and 26, on the other hand, are each formed of a pair of rigid members which are pivotally coupled to one another by appropriate pins 28 and 29.

Figure 2:
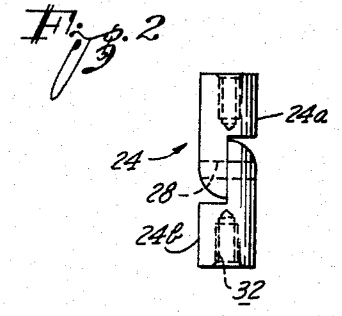
FIGURES 2, 3 and 4 show various modifications of the stand-off support elements used in the practice of the invention.

The stand-off elements 24 and 26 may be of the form shown in FIGURE 2, in which the stand-off element 24, for example, is shown as composed of a pair of members **24*a* and 24*b*, the members being pivotally coupled to one another by a pin 28. A threaded bore 30 is provided at the top of the member 24*a*, and a threaded bore 32 is provided at the bottom of the member 24*b***.

The stand-off elements, such as the elements 24 and 26, may be appropriately mounted to the base 10 and to the panel 18 by suitable screws which extend through the panel and base, and which are threaded into the respective bores 30 and 32.

A further plurality of electrical components 36 are mounted on the underside of the terminal panel 10, and other components and terminals may be mounted on the upper side of the panel.

The panel 18 is shown in FIGURE 1 as moved up to an open position with respect to the base 10, so that servicing and testing may conveniently be carried out on the components and circuitry supported on its underside, and on the components and circuitry supported on the base itself.

When the panel 18 of FIGURE 1 is turned down into place, on the posts 20 and 22, it may be secured to the posts by appropriate screws extending, for example, through the holes 40 and 42 in the panel, and threaded into the respective posts 20 and 22. When in the latter position, the terminal panel 18 is rigidly held in spaced relationship with the base 10. Then, whenever servicing is required, it is a simple matter to remove the screws from the posts 20 and 22, and to turn up the panel 18 to the position shown in FIGURE 1.

It will be appreciated that when the panel is in the turned up position shown in FIGURE 1, it is still rigidly supported on the base 10, and there is no tendency for the panel to short-circuit or damage the other elements on the base.

Figure 3:
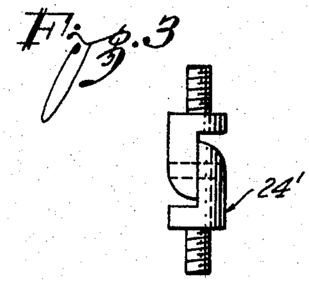

As shown in FIGURE 3, the hinged stand-off elements, such as the element 24, may have male threads, so as to receive nuts, the latter assembly being designated 24′ in FIGURE 3.

Figure 4:
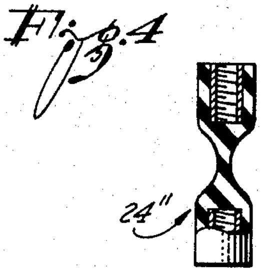

Likewise, and as designated 24″ in FIGURE 4, the hinge type stand-off element can be formed of any appropriate resilient material.

As also shown in FIGURE 1, electrical connection can be established between the components on the terminal board, and on the base 10, by means of resilient electrical conductors 50. These conductors may take the form shown in FIGURES 5 or 6, for example.

Figure 5:
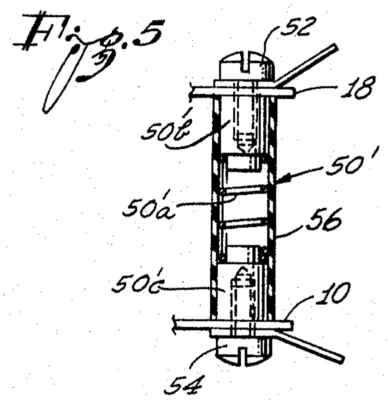
FIGURES 5 and 6 show two embodiments of a resilient conductor, which also may be used in the practice of the invention.

For example, in FIGURE 5, the resilient conductor is designated 50′, and it incluudes a helical spring 50*a′* and a pair of metallic end terminals 50*b′* and 50*c′*.

The end terminal 50*b′* is interposed between the lower surface of the panel 18 and the top of spring 50*a′*, whereas the lower terminal 50*c′* is interposed between the lower end of the spring 50*a′* and the base 10. Each of the terminal members 50*b′* and 50*c′* have threaded bores, so that appropriate connections can be made to them by ways of screws 52 and 54 which are threaded into the respective bores. Alternately, soldered or welded connections can be made to the terminal members 50*a′* or 50*b′*.

As shown in FIGURE 5, each of the terminals 50*b′* and 50*c′* has a tubular configuration, and each has a portion overlying the corresponding end of the spring 50*a′*, and a portion extending into the spring for centering purposes.

The entire terminal assembly of FIGURE 5 may be encased in a flexible tubular casing 56. This casing may be composed of any appropriate flexible material. For example, it may be composed of polyolefin plastic. This plastic has a feature in that it can be slipped over the other components and heated, the plastic will then shrink into a tight fit with the components and retain that fit.

It will be appreciated that electrical connection is established through the resilient connector through the end terminals 50*b′* and 50*c′*, and through the electrically conductive helical spring 50*a′*.

Figure 6:
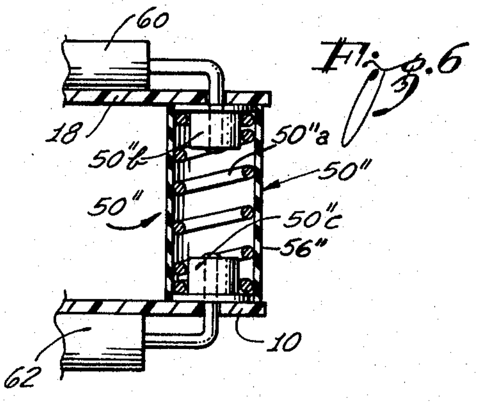

The assembly shown in FIGURE 6 is generally similar to the assembly shown in FIGURE 5, except that the end terminals, designated 50*b″* and 50*c″* have a slightly different configuration from the end terminals 50*b′* and 50*c′*.

In the latter embodiment, electrical components, such as the components 60 and 62 may be interconnected by the resilient connector, each having its pigtail connection soldered in place in a central opening in the respective terminals 50*b″* and 50*c″*.

In the connector of FIGURE 6, elements similar to that of FIGURE 5 are designated by the same numerals. but with a double-primed (″) designation.

While particular embodiments of the invention have been shown and described, modifications may be made. It is intended in the claims to cover all modifications which come within the scope of the invention.

What is claimed is:

1. An electrical equipment assembly including: a base; a plurality of stand-off elements mounted on said base; a terminal panel mounted on said stand-off elements and supported thereby in spaced relationship from said base; at least some of said stand-off elements each including a pair of members pivotally coupled to one another to permit said panel to be moved angularly towards and away from said base; and at least one resilient electrical conductor extending between said panel and said base, said resilient electrical conductor including a helical spring of electrically conductive material, a flexible tubular insulating casing surrounding said spring, and a pair of electrically conductive terminal end members positioned in said casing and respectively interposed between the ends of said spring and said panel and base respectively, said electrically conductive terminal end members being connected to circuitry on siad base and on said terminal panel and said helical spring completing an electrical connection between said electrically conductive terminal end member.

2. The assembly defined in claim 1 in which at least one of said stand-off elements includes a first rigid metallic member having a generally cylindrical configuration, a second rigid metallic member having a generally cylindrical configuration, and a pin intercoupling said members in pivotal relationship.

3. The assembly defined in claim 1 in which at least one of said stand-off elements is composed of resilient material.

4. The assembly defined in claim 1 in which said terminal end members are in the form of metallic bushings respectively extending into said helical spring, and each having a flange portion extending outwardly across the corresponding end of said spring.

References Cited

UNITED STATES PATENTS

| | | | |
|---|---|---|---|
| 2,740,097 | 3/1956 | Edelman et al. | |
| 3,131,330 | 4/1964 | Allen | 317—99 |
| 3,193,638 | 7/1965 | Carter et al. | 339—59 |

ROBERT K. SCHAEFER, *Primary Examiner.*

D. SMITH, *Assistant Examiner.*